United States Patent
Mitsugi et al.

(10) Patent No.: US 11,982,696 B2
(45) Date of Patent: May 14, 2024

(54) SYSTEM FREQUENCY DETECTOR

(71) Applicant: Toshiba Mitsubishi-Electric Industrial Systems Corporation, Tokyo (JP)

(72) Inventors: Yasuaki Mitsugi, Tokyo (JP); Takashi Shigemasa, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 184 days.

(21) Appl. No.: 17/755,931

(22) PCT Filed: May 26, 2020

(86) PCT No.: PCT/JP2020/020722
§ 371 (c)(1),
(2) Date: May 12, 2022

(87) PCT Pub. No.: WO2021/240639
PCT Pub. Date: Dec. 2, 2021

(65) Prior Publication Data
US 2022/0413024 A1    Dec. 29, 2022

(51) Int. Cl.
*H03K 5/00*    (2006.01)
*G01R 23/06*    (2006.01)
*G01R 23/12*    (2006.01)
*H03K 5/26*    (2006.01)

(52) U.S. Cl.
CPC ............. *G01R 23/06* (2013.01); *G01R 23/12* (2013.01); *H03K 5/26* (2013.01)

(58) Field of Classification Search
CPC ........ G01R 23/02; G01R 23/12; G01R 23/06; H03K 5/26
See application file for complete search history.

(56) References Cited

U.S. PATENT DOCUMENTS

| | | | |
|---|---|---|---|
| 8,704,571 B2 | 4/2014 | Kerkman et al. | |
| 10,270,327 B1* | 4/2019 | Fu | H02M 7/53871 |
| 2022/0137110 A1* | 5/2022 | Mitsugi | H02J 3/38 |
| | | | 324/76.39 |

OTHER PUBLICATIONS

International Search Report and Written Opinion dated Aug. 18, 2020, received for PCT Application PCT/JP2020/020722, Filed on May 26, 2020, 10 pages including English Translation.

* cited by examiner

*Primary Examiner* — Tuan T Lam
(74) *Attorney, Agent, or Firm* — XSENSUS LLP (57) ABSTRACT

A system includes an orthogonal coordinate signal generator that generates an orthogonal two-phase voltage signal from a three-phase voltage signal of three-phase alternating current power of a power system; and a frequency calculator including an angular frequency calculator calculating an angular frequency of the power system based on the two-phase voltage signal, and an arithmetic unit calculating a system frequency of the power system from the angular frequency. A prediction calculator calculates a predicted value of the angular frequency after a time has elapsed based on the angular frequency and a differential of the angular frequency. In a state in which the phase jump of the power system is not detected, the frequency calculator calculates the system frequency based on the angular frequency. When the phase jump of the power system is detected, the frequency calculator calculates the system frequency based on predicted value for a constant amount of time.

4 Claims, 6 Drawing Sheets

SYSTEM FREQUENCY DETECTOR

FIELD

Embodiments described herein relate to a system frequency detector.

BACKGROUND ART

A zero crossing point detection-type frequency calculation is known as a technique of detecting a system frequency of a power system. The zero crossing point detection-type frequency calculation can take measurement data only in intervals synchronized with the system frequency; ordinarily, a filter of a relatively long time constant that is not less than 200 msec (milliseconds) has been provided to acquire resistance to system disturbances. Therefore, for example, rapid output tracking for a change of the system frequency such as tracking with a delay that is not more than 40 msec, etc., is difficult.

Also, a frequency calculation using PLL (Phase Locked Loop) using a DQ transformation also is known. Such a frequency calculation using PLL can be used as a good frequency detector if there is no trouble at the power system side; and the system frequency can be tracked more quickly than the zero crossing point detection-type frequency calculation. However, there are cases where the calculated frequency temporarily oscillates greatly when a phase jump occurs in the system voltage.

Therefore, in a system frequency detector, it is desirable to be able to quickly track the change of the system frequency and to be able to suppress an erroneous detection of the system frequency even when a system disturbance occurs.

CITATION LIST

Patent Literature

[PTL 1]
U.S. Pat. No. 8,704,571 B1

SUMMARY OF INVENTION

Technical Problem

Embodiments of the invention provide a system frequency detector in which the change of the system frequency can be quickly tracked and an erroneous detection of the system frequency can be suppressed even when a system disturbance occurs.

Solution to Problem

According to one embodiment, a system frequency detector includes an orthogonal coordinate signal generator generating an orthogonal two-phase voltage signal from a three-phase voltage signal of three-phase alternating current power of a power system by converting the three-phase voltage signal into an orthogonal two-phase voltage signal, converting the two-phase voltage signal into a voltage signal of a rotating coordinate system, calculating a moving average of the voltage signal of the rotating coordinate system, and performing an inverse transformation of the voltage signal of the rotating coordinate system after calculating the moving average; and a frequency calculator including an angular frequency calculator calculating an angular frequency of the power system based on the two-phase voltage signal after calculating the moving average generated by the orthogonal coordinate signal generator, and an arithmetic unit calculating a system frequency of the power system from the angular frequency by multiplying the angular frequency by ½π, the angular frequency calculator calculating the angular frequency by performing a proportional-integral control based on the two-phase voltage signal, the frequency calculator further including a rate limiter limiting a change of the system frequency equal to or greater than a prescribed change rate, the rate limiter feeding back an output-input difference of the rate limiter to the calculation of the proportional-integral control of the angular frequency calculator, a prediction calculator calculating a predicted value of the angular frequency after a prescribed period of time has elapsed based on the angular frequency output from the rate limiter and a differential of the angular frequency, and a switching circuit selectively switching a first state of inputting the angular frequency output from the rate limiter to the arithmetic unit, and a second state of inputting the predicted value output from the prediction calculator to the arithmetic unit, the switching circuit detecting a phase jump of the power system based on the voltage signal of the rotating coordinate system calculated by the orthogonal coordinate signal generator, selecting the first state in a state in which the phase jump of the power system is not detected, selecting the second state for a constant amount of time when the phase jump of the power system is detected, and returning the second state to the first state after the constant amount of time has elapsed.

Advantageous Effects of Invention

According to embodiments of the invention, a system frequency detector is provided in which the change of the system frequency can be quickly tracked and an erroneous detection of the system frequency can be suppressed even when a system disturbance occurs.

DESCRIPTION OF EMBODIMENTS

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

Figure 1:
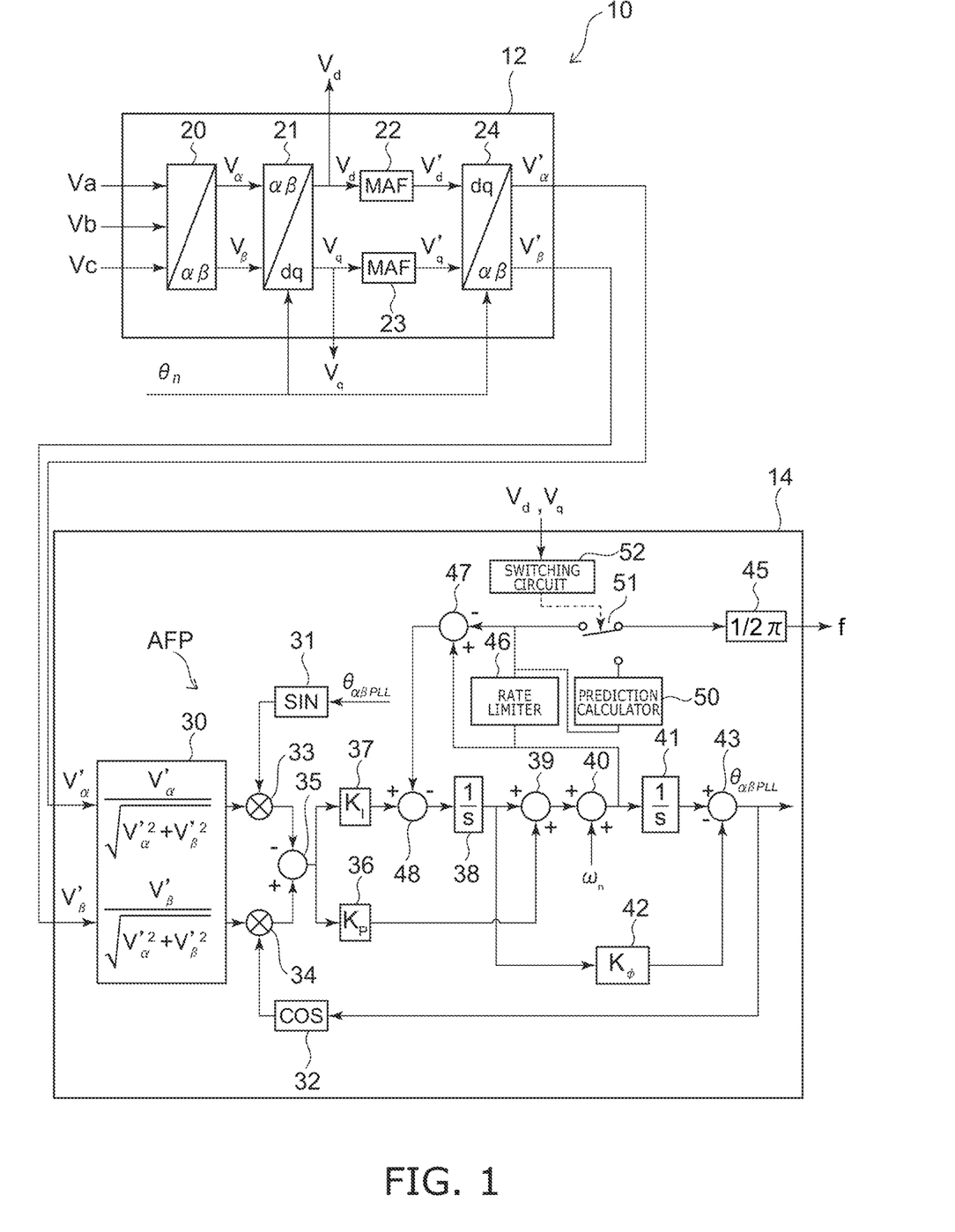
FIG. 1 is a block diagram schematically illustrating a system frequency detector.

FIG. 1 is a block diagram schematically illustrating a system frequency detector.

As illustrated in FIG. 1, the system frequency detector 10 includes an orthogonal coordinate signal generator 12 and a frequency calculator 14. The system frequency detector 10 detects the system frequency of a power system of three-phase alternating current power.

For example, the system frequency detector 10 is used in a power conversion device in which a distributed power source such as solar power generation, wind power generation, or the like is connected with a power system, etc. However, applications of the system frequency detector 10 are not limited thereto. The system frequency detector 10 can be used in any device in which it is necessary to detect the system frequency of a power system of three-phase alternating current power.

The orthogonal coordinate signal generator 12 generates orthogonal two-phase voltage signals $V_\alpha'$ and $V_\beta'$ from three-phase voltage signals $V_a$, $V_b$, and $V_c$ of the three-phase alternating current power of the power system. For example, the three-phase voltage signals $V_a$, $V_b$, and $V_c$ are detected by a voltage detector or the like and are input to the orthogonal coordinate signal generator 12. For example, the three-phase voltage signals $V_a$, $V_b$, and $V_c$ are instantaneous values of a three-phase alternating current voltage input at a prescribed sampling interval.

The orthogonal coordinate signal generator 12 includes a three-phase to two-phase converter 20, a rotating coordinate converter 21, moving average filters 22 and 23, and an inverse converter 24.

The three-phase to two-phase converter 20 converts the three-phase voltage signals $V_a$, $V_b$, and $V_c$ into two-phase voltage signals $V_\alpha$ and $V_\beta$ of an α-phase and a β-phase by performing an α-β transformation (a Clarke transformation).

The two-phase voltage signals $V_\alpha$ and $V_\beta$ are input to the rotating coordinate converter 21, and a nominal phase $\theta_n$ obtained by integrating a nominal angular frequency $\omega_n$ of the power system is input to the rotating coordinate converter 21. The rotating coordinate converter 21 performs a rotating coordinate transformation of voltage signals $V_\alpha$ and $V_\beta$ of the orthogonal two-axis coordinates into voltage signals $V_d$ and $V_q$ of a coordinate system (dq coordinates) synchronized with the phase $\theta_n$ by a so-called dq transformation (a Park transformation). The voltage signal $V_d$ is a voltage signal of the d-axis component of the three-phase alternating current power (the voltage signals $V_a$, $V_b$, and $V_c$) of the power system; and the voltage signal $V_q$ is a voltage signal of the q-axis component of the three-phase alternating current power (the voltage signals $V_a$, $V_b$, and $V_c$) of the power system.

The moving average filter 22 outputs a voltage signal $V_d'$ after the moving average calculation by calculating the moving average of the voltage signal $V_d$. Similarly, the moving average filter 23 outputs a voltage signal $V_q'$ after the moving average calculation by calculating the moving average of the voltage signal $V_q$. Thus, the moving average filters 22 and 23 suppress the high frequency components of the voltage signals $V_d$ and $V_q$ by calculating the moving averages of the voltage signals $V_d$ and $V_q$. For example, the moving average filters 22 and 23 suppress the harmonic components included in the voltage signals $V_d$ and $V_q$. For example, the undesirable effects on the detection of the system frequency due to trouble at the power system side such as voltage imbalance of the three phases, harmonics, noise, etc., can be suppressed thereby.

By performing an inverse transformation of the voltage signals $V_d'$ and $V_q'$ of the rotating coordinate system into an orthogonal two-axis coordinate system, the inverse converter 24 converts the voltage signals $V_d'$ and $V_q'$ into the voltage signals $V_\alpha'$ and $V_\beta'$ of the orthogonal two-axis coordinates after the moving average calculation. Thereby, the orthogonal coordinate signal generator 12 generates the orthogonal two-phase voltage signals $V_\alpha'$ and $V_\beta'$ from the three-phase voltage signals $V_a$, $V_b$, and $V_c$.

The frequency calculator 14 calculates a system frequency f of the power system based on the two-phase voltage signals $V_\alpha'$ and $V_\beta'$ generated by the orthogonal coordinate signal generator 12. By using a PLL (Phase-Locked-Loop) calculation, the frequency calculator 14 detects a synchronous phase $\theta_{\alpha\beta PLL}$ synchronized with the voltage signals $V_\alpha'$ and $V_\beta'$ after the two-phase conversion and calculates the system frequency f of the power system from an angular frequency ω obtained in the detection process of the synchronous phase $\theta_{\alpha\beta PLL}$.

The frequency calculator 14 includes an angular frequency calculator AFP. The angular frequency calculator AFP includes, for example, arithmetic units 30, 31, and 32, multipliers 33 and 34, a subtractor 35, arithmetic units 36 and 37, an integrator 38, adders 39 and 40, an integrator 41, an arithmetic unit 42, and a subtractor 43.

The arithmetic unit 30 calculates $\cos \theta_n$ and $\sin \theta_n$ from the two-phase voltage signals $V_\alpha'$ and $V_\beta'$. The arithmetic unit 30 calculates $\cos \theta_n$ by using the formula $V_\alpha'/\sqrt{(V_\alpha'^2 + V_\beta'^2)}$, and calculates $\sin \theta_n$ by using the formula $V_\beta'/\sqrt{(V_\alpha'^2 + V_\beta'^2)}$. The arithmetic unit 30 inputs the calculated $\cos \theta_n$ to the multiplier 33, and inputs the calculated $\sin \theta_n$ to the multiplier 34.

The arithmetic unit 31 calculates $\sin \theta_{\alpha\beta PLL}$ based on the detected synchronous phase $\theta_{\alpha\beta PLL}$, and inputs $\sin \theta_{\alpha\beta PLL}$ to the multiplier 33.

The arithmetic unit 32 calculates $\cos \theta_{\alpha\beta PLL}$ based on the detected synchronous phase $\theta_{\alpha\beta PLL}$, and inputs $\cos \theta_{\alpha\beta PLL}$ to the multiplier 34.

The multiplier 33 multiplies the input $\cos \theta_n$ and $\sin \theta_{\alpha\beta PLL}$ and inputs the multiplication result to the subtractor 35.

The multiplier 34 multiplies the input $\sin \theta_n$ and $\cos \theta_{\alpha\beta PLL}$ and inputs the multiplication result to the subtractor 35.

The subtractor 35 calculates an error phase Δθ between the phase $\theta_n$ of the power system and the synchronous phase $\theta_{\alpha\beta PLL}$ by calculating $\sin \theta_n \cdot \cos \theta_{\alpha\beta PLL} - \cos \theta_n \cdot \sin \theta_{\alpha\beta PLL}$. The frequency calculator 14 calculates the error phase Δθ as $$\Delta\theta = \theta_n - \theta_{\alpha\beta PLL} \approx \sin \theta_n \cdot \cos \theta_{\alpha\beta PLL} - \cos \theta_n \cdot \sin \theta_{\alpha\beta PLL}.$$

The arithmetic unit 36 multiplies the error phase Δθ by a proportional gain $K_P$ and inputs the multiplication result to the adder 39.

The arithmetic unit 37 multiplies the error phase Δθ by an integral gain $K_I$ and inputs the multiplication result to the integrator 38.

The integrator 38 integrates the multiplication result of the error phase Δθ and the integral gain $K_I$ and inputs the integral to the adder 39.

The adder 39 adds the multiplication result of the arithmetic unit 36 and the integral of the integrator 38. The arithmetic units 36 and 37, the integrator 38, and the adder 39 calculate a command value $\Delta\omega$ of the angular frequency for setting the error phase $\Delta\theta$ to zero by a so-called proportional-integral control.

The command value $\Delta\omega$ of the angular frequency calculated by the adder 39 is input to the adder 40; and the nominal angular frequency $\omega_n$ of the power system is input to the adder 40. The adder 40 calculates the angular frequency $\omega$ of the power system by adding the command value $\Delta\omega$ of the angular frequency and the nominal angular frequency $\omega_n$ of the power system. Thus, the angular frequency calculator AFP calculates the angular frequency $\omega$ by performing the proportional-integral control based on the two-phase voltage signals $V_\alpha'$ and $V_\beta'$.

The integrator 41 calculates a synchronous phase $\theta$ from the angular frequency $\omega$ by integrating the angular frequency $\omega$ calculated by the adder 40. The integrator 41 inputs the calculated synchronous phase $\theta$ to the subtractor 43.

The arithmetic unit 42 calculates a correction value by multiplying the integration result of the integrator 38 by a constant $K_\phi$. The constant $K_\phi$ is determined by $K_\phi=(T_\omega-T_{SP})/2$. $T_{SP}$ is the sampling interval of the voltage signals $V_a$, $V_b$, and $V_c$. $T_\omega$ is the window length of the moving average filters 22 and 23. $T_\omega$ is represented by $N \cdot T_{SP}$, where N is the averaging number of the moving average filters 22 and 23. The arithmetic unit 42 inputs the calculated correction value to the subtractor 43.

The subtractor 43 corrects the synchronous phase $\theta$ by subtracting the correction value from the synchronous phase $\theta$. The subtractor 43 calculates the synchronous phase $\theta_{\alpha\beta PLL}$ by the correction.

The angular frequency calculator AFP synchronizes the synchronous phase $\theta_{\alpha\beta PLL}$ with the phase $\theta_n$ of the power system by feeding back the detected synchronous phase $\theta_{\alpha\beta PLL}$ to the arithmetic units 31 and 32. Thus, based on the angular frequency $\omega$, the angular frequency calculator AFP detects the synchronous phase $\theta_{\alpha\beta PLL}$ synchronized with the two-phase voltage signals $V_\alpha'$ and $V_\beta'$ after calculating the moving averages, calculates the error phase $\Delta\theta$ between the nominal phase $\theta_n$ of the power system and the synchronous phase $\theta_{\alpha\beta PLL}$, and calculates the angular frequency $\omega$ to cause the error phase $\Delta\theta$ to be zero. For example, the configuration of the PLL of the angular frequency calculator AFP (the frequency calculator 14) of the example may be called an $\alpha\beta$EPMAFPLL ($\alpha\beta$ Enhanced Pre-filtering Moving Average Filter PLL).

The frequency calculator 14 further includes an arithmetic unit 45, a rate limiter 46, subtractors 47 and 48, a prediction calculator 50, a switching element 51, and a switching circuit 52. The frequency calculator 14 calculates the system frequency f of the power system from the calculated angular frequency $\omega$. The adder 40 inputs the calculated angular frequency $\omega$ to the integrator 41 and inputs the angular frequency $\omega$ to the rate limiter 46.

The rate limiter 46 limits a change of the system frequency f equal to or greater than a prescribed change rate by limiting a change of the angular frequency $\omega$ equal to or greater than a prescribed change rate. For example, the rate limiter 46 suppresses the change of the system frequency f equal to or greater than 4 Hz/sec.

Thus, by providing the rate limiter 46, even when a phase jump or the like occurs in the power system, an abrupt fluctuation of the system frequency f can be suppressed, and the error of the calculation of the system frequency f can be reduced.

The subtractor 47 is connected with the input and output sides of the rate limiter 46. The subtractor 47 subtracts the output value of the rate limiter 46 from the input value of the rate limiter 46. In other words, the subtractor 47 calculates the difference between the input value and the output value of the rate limiter 46. The difference is calculated by the subtractor 47 when the calculated value of the angular frequency $\omega$ abruptly increases, the angular frequency $\omega$ is limited by the rate limiter 46, and the output value of the rate limiter 46 drops below the input value of the rate limiter 46. The subtractor 47 inputs the calculation result of the difference to the subtractor 48.

The subtractor 48 is provided between the arithmetic unit 37 and the integrator 38 of the angular frequency calculator AFP. The subtractor 48 subtracts the calculation result of the difference of the subtractor 47 from the multiplication result of the arithmetic unit 37 multiplying the error phase $\Delta\theta$ by the integral gain $K_I$. In other words, when the rate limiter 46 limits the angular frequency $\omega$, the subtractor 48 subtracts the amount limited by the rate limiter 46 from the calculation of the integration operation of the proportional-integral control.

Thus, in the frequency calculator 14, the subtractors 47 and 48 are provided and feed back the output-input difference of the rate limiter 46 to the calculation of the proportional-integral control of the angular frequency calculator AFP. Even when a phase jump or the like occurs in the power system, an abrupt fluctuation of the system frequency f can be more reliably suppressed thereby, and the error of the calculation of the system frequency f can be further reduced. For example, such control of the feedback may be called Anti reset wind up.

The prediction calculator 50 is provided in series with the rate limiter 46. The prediction calculator 50 calculates a predicted value $\omega'$ of the angular frequency $\omega$ after a prescribed period of time has elapsed based on the angular frequency $\omega$ output from the rate limiter 46 and the differential of the angular frequency $\omega$.

The switching element 51 selectively switches between the state in which only the rate limiter 46 is connected in series to the arithmetic unit 45 and the state in which the rate limiter 46 and the prediction calculator 50 are connected in series to the arithmetic unit 45. At this time, when the switching element 51 is in either state, the output of the rate limiter 46 is input to the subtractor 47; and the output-input difference of the rate limiter 46 is fed back to the calculation of the proportional-integral control of the angular frequency calculator AFP.

The switching circuit 52 selectively switches between a first state in which the angular frequency $\omega$ output from the rate limiter 46 is input to the arithmetic unit 45, and a second state in which the predicted value $\omega'$ output from the prediction calculator 50 is input to the arithmetic unit 45. For example, the switching circuit 52 selectively switches between the first state and the second state by controlling the switching of the path by the switching element 51.

However, the switching between the first state and the second state is not limited thereto. For example, the first state may be taken to be when only the rate limiter 46 operates; and the second state may be taken to be when the rate limiter 46 and the prediction calculator 50 operate. In such a case, the switching element 51 is omissible.

The voltage signal $V_d$ of the d-axis component and the voltage signal $V_q$ of the q-axis component that are calculated by the rotating coordinate converter 21 of the orthogonal coordinate signal generator 12 are input to the switching circuit 52. The switching circuit 52 detects the phase jump of the power system based on the input voltage signals $V_d$ and $V_q$. In the state in which the phase jump of the power system is not detected, the switching circuit 52 selects the first state and inputs the angular frequency ω to the arithmetic unit 45. Then, when the phase jump of the power system is detected, the switching circuit 52 selects the second state for the constant amount of time, and inputs the predicted value ω' to the arithmetic unit 45 for the constant amount of time. The switching circuit 52 returns the second state to the first state after the elapse of the constant amount of time.

The arithmetic unit 45 calculates the system frequency f from the angular frequency ω or the predicted value ω' by multiplying the angular frequency ω or the predicted value ω' of the angular frequency ω by ½π.

Thus, the frequency calculator 14 calculates the system frequency f of the power system from the two-phase voltage signals $V_\alpha'$ and $V_\beta'$. The system frequency detector 10 detects the system frequency f of the power system from the three-phase voltage signals $V_a$, $V_b$, and $V_c$.

Figure 2:
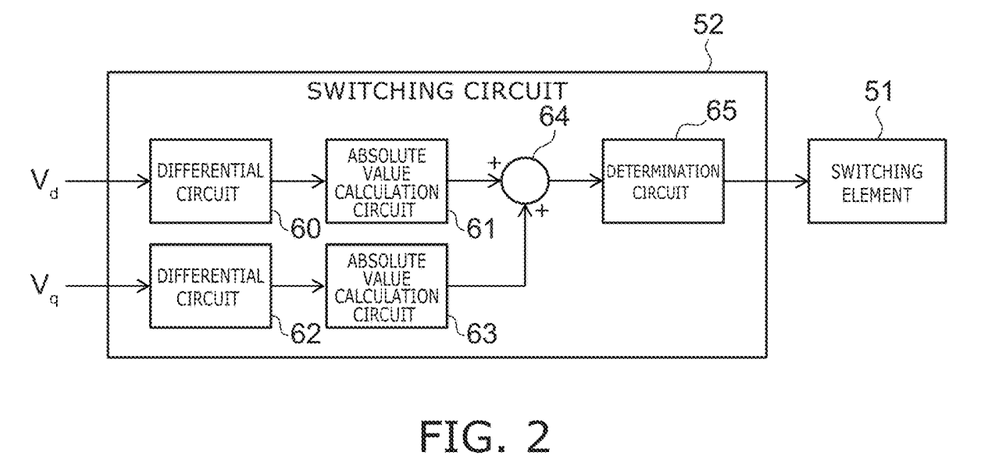
FIG. 2 is a block diagram schematically illustrating the switching circuit.

FIG. 2 is a block diagram schematically illustrating the switching circuit.

As illustrated in FIG. 2, the switching circuit 52 includes a differential circuit 60, an absolute value calculation circuit 61, a differential circuit 62, an absolute value calculation circuit 63, an adder 64, and a determination circuit 65. The voltage signals $V_d$ and $V_q$ that are calculated by the rotating coordinate converter 21 are input to the switching circuit 52.

The differential circuit 60 calculates the differential of the voltage signal $V_d$. In other words, the differential circuit 60 calculates the slope of the voltage signal $V_d$. The absolute value calculation circuit 61 calculates the absolute value of the differential of the voltage signal $V_d$ calculated by the differential circuit 60.

Similarly, the differential circuit 62 calculates the differential of the voltage signal $V_q$. In other words, the differential circuit 62 calculates the slope of the voltage signal $V_q$. The absolute value calculation circuit 63 calculates the absolute value of the differential of the voltage signal $V_q$ calculated by the differential circuit 62.

The adder 64 calculates the total value of the absolute value of the differential of the voltage signal $V_d$ and the absolute value of the differential of the voltage signal $V_q$ and inputs the calculated total value to the determination circuit 65.

The determination circuit 65 determines whether or not the input total value is not less than a prescribed value. The voltage signal $V_d$ of the d-axis component and the voltage signal $V_q$ of the q-axis component of the three-phase alternating current power of the power system abruptly change when a phase jump occurs in the power system (referring to FIG. 4D). Therefore, when the total value of the absolute value of the differential of the voltage signal $V_d$ and the absolute value of the differential of the voltage signal $V_q$ reaches or exceeds the prescribed value, it can be considered that a phase jump has occurred in the power system.

The determination circuit 65 switches the path of the switching element 51. When the total value is less than the prescribed value, the determination circuit 65 sets the switching element 51 to the state in which the output of the rate limiter 46 is input to the arithmetic unit 45. In other words, the first state is selected when the determination circuit 65 determines that the phase jump has not occurred in the power system.

When the total value is not less than the prescribed value, the determination circuit 65 sets the switching element 51 to the state in which the output of the prediction calculator 50 is input to the arithmetic unit 45. In other words, the second state is selected when the determination circuit 65 determines that a phase jump has occurred in the power system.

Thus, the switching circuit 52 selects the first state when the total value of the absolute value of the differential of the voltage signal $V_d$ and the absolute value of the differential of the voltage signal $V_q$ is less than the prescribed value, and selects the second state when the total value is not less than the prescribed value.

When switching from the first state to the second state, for example, the determination circuit 65 determines whether or not a constant amount of time has elapsed from the timing of switching from the first state to the second state and returns the second state to the first state after the constant amount of time has elapsed.

In other words, the frequency calculator 14 calculates the system frequency f based on the angular frequency ω output from the rate limiter 46, and when determining that a phase jump has occurred in the power system, switches to the predicted value ω' output from the prediction calculator 50 for a constant amount of time, and calculates the system frequency f based on the predicted value ω' for the constant amount of time from the determination of the occurrence of the phase jump.

The system frequency detector 10 may have the function of externally outputting the detection result of the occurrence of the phase jump. Thereby, for example, in a power conversion device that includes the system frequency detector 10, etc., it is possible to utilize the detection result of the occurrence of the phase jump; and the functionality of the system frequency detector 10 can be further increased.

Figure 3:
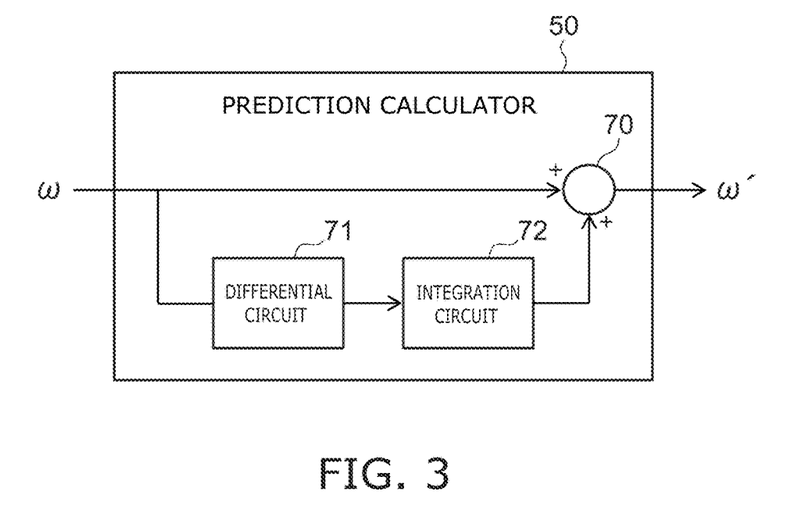
FIG. 3 is a block diagram schematically illustrating the prediction calculator.

FIG. 3 is a block diagram schematically illustrating the prediction calculator.

As illustrated in FIG. 3, the prediction calculator 50 includes an adder 70, a differential circuit 71, and an integration circuit 72.

The prediction calculator 50 inputs the angular frequency ω output from the rate limiter 46 to the adder 70 and inputs the angular frequency ω output from the rate limiter 46 to the differential circuit 71. More specifically, the prediction calculator 50 inputs, to the adder 70 and the differential circuit 71, an angular frequency ω(t0) at a timing t0 at which it is determined that a phase jump occurred in the power system.

The differential circuit 71 calculates a differential dω(t0)/dt of the input angular frequency ω(t0) differentiated over time. The integration circuit 72 calculates the prediction change amount (t−t0)×dω(t0)/dt of the angular frequency ω after a prescribed period of time t has elapsed from the timing t0 at which it is determined that the phase jump occurred by integrating the differential dω(t0)/dt, and inputs the prediction change amount (t−t0)×dω(t0)/dt to the adder 70.

The adder 70 calculates the predicted value ω' of the angular frequency ω by adding the angular frequency ω(t0) at the timing t0 at which it is determined that the phase jump occurred and the prediction change amount (t−t0)×dω(t0)/dt. In other words, the prediction calculator 50 calculates the predicted value ω' using the following Formula (1).

[Formula 1]

$$\omega'(t) = \omega(t0) + \frac{d\omega}{dt}(t0)(t - t0) \quad (1)$$

Thus, the prediction calculator 50 calculates the predicted value ω' of the angular frequency ω after a prescribed period of time has elapsed based on the angular frequency ω and the differential of the angular frequency ω. For example, as illustrated in Formula (1), the prediction calculator 50 fixes the angular frequency ω and the differential used in the calculation to be the angular frequency ω(t0) at the timing t0 at which it is determined that the phase jump occurred and the differential dω(t0)/dt.

FIGS. 4A to 4G are graphs schematically illustrating examples of operations of the system frequency detector.

In FIGS. 4A to 4G, the horizontal axis is time.

Figure 4A:
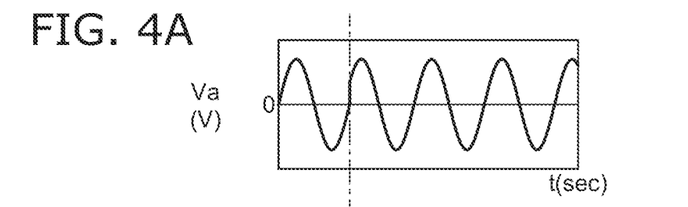
FIGS. 4A to 4G are graphs schematically illustrating examples of operations of the system frequency detector.

The vertical axis of FIG. 4A is an example of the three-phase voltage signal $V_a$.

Figure 4B:
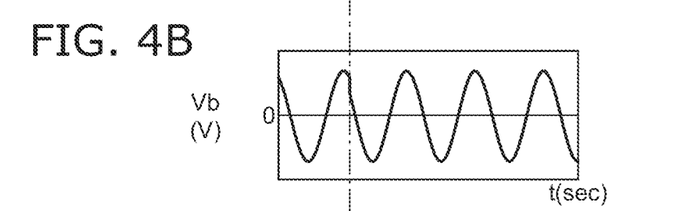

The vertical axis of FIG. 4B is an example of the three-phase voltage signal $V_b$.

Figures 4C, 4D:
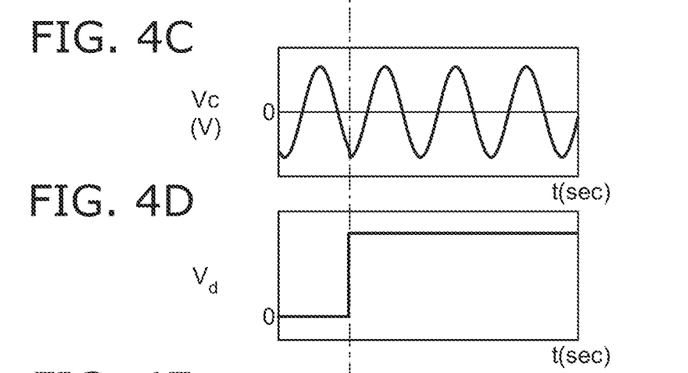

The vertical axis of FIG. 4C is an example of the three-phase voltage signal $V_c$.

The vertical axis of FIG. 4D is an example of the voltage signal $V_d$ of the rotating coordinate system.

Figure 4E:
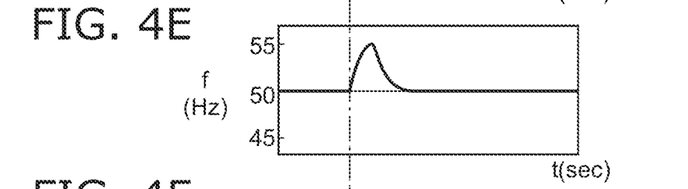

The vertical axis of FIG. 4E is an example of a reference system frequency f calculated by the arithmetic unit 45 as-is from the angular frequency ω calculated by the adder 40 without passing through the rate limiter 46, etc.

Figure 4F:
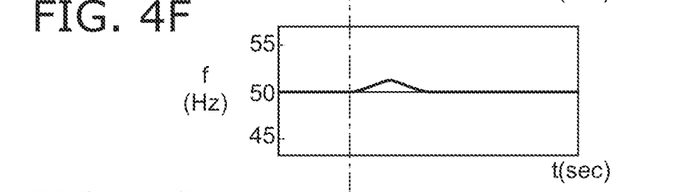

The vertical axis of FIG. 4F is an example of a reference system frequency f calculated by the configuration of the system frequency detector 10 in which the angular frequency ω output from the rate limiter 46 is input to the arithmetic unit 45 without switching to the prediction calculator 50 even when the phase jump occurs.

Figure 4G:
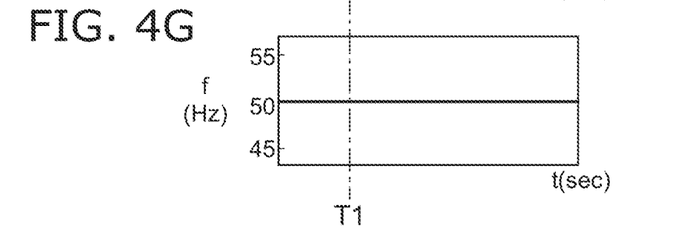

The vertical axis of FIG. 4G is an example of a system frequency f calculated by the configuration of the system frequency detector 10.

FIGS. 4A to 4G illustrate examples when a phase jump of about 30 degrees occurs at a time T1. Also, in FIGS. 4A to 4G, the actual system frequency of the power system is set to 50 Hz.

As illustrated in FIG. 4D, the voltage signal $V_d$ of the d-axis component of the three-phase alternating current power of the power system abruptly changes when the phase jump occurs. Similarly, the voltage signal $V_q$ of the q-axis component also abruptly changes.

As illustrated in FIG. 4E, a mismeasurement of about 5 Hz occurs when the phase jump occurs when the system frequency f is calculated without using the rate limiter 46, etc.

Conversely, in a configuration in which the output-input difference of the rate limiter 46 is fed back to the calculation of the proportional-integral control as illustrated in FIG. 4F, the mismeasurement when the phase jump occurs can be suppressed to about 1 Hz.

Also, the mismeasurement when the phase jump occurs can be further suppressed in the system frequency detector 10 that switches from the angular frequency ω of the rate limiter 46 to the predicted value ω' of the prediction calculator 50 when the occurrence of the phase jump is detected. In the system frequency detector 10, the mismeasurement can be suppressed to about 0.01 Hz.

For example, when the actual system frequency of the power system is substantially constant as in the example illustrated in FIG. 4, the differential dω(t0)/dt of the angular frequency ω(t0) at the timing t0 at which it is determined that the phase jump occurred is substantially 0. Accordingly, in such a case, ω'≈ω(t0), and the fluctuation of the system frequency f can be suppressed.

Figure 5A:
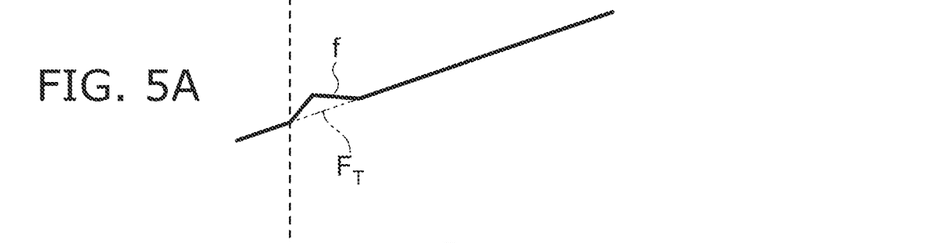
FIGS. 5A to 5C are graphs schematically illustrating examples of operations of the system frequency detector.
Figure 5B:
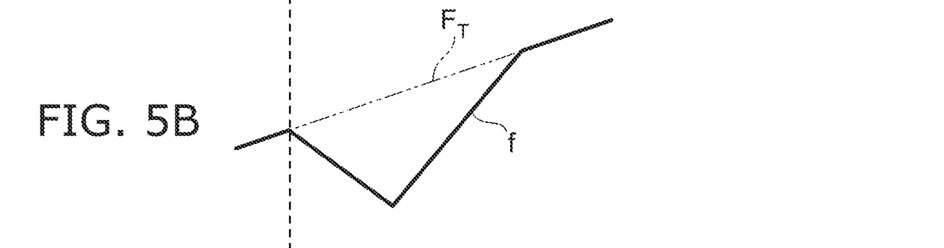
Figure 5C:
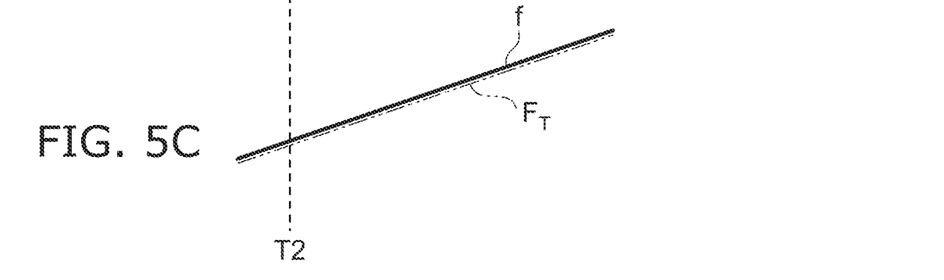

FIGS. 5A to 5C are graphs schematically illustrating examples of operations of the system frequency detector.

In FIGS. 5A to 5C, the horizontal axis is time.

In FIGS. 5A and 5B, the vertical axis is an example of a reference system frequency f calculated by the configuration of the system frequency detector 10 in which the angular frequency ω output from the rate limiter 46 is input to the arithmetic unit 45 without switching to the prediction calculator 50 even when the phase jump occurs.

The vertical axis of FIG. 5C is an example of the system frequency f calculated by the configuration of the system frequency detector 10.

FIGS. 5A to 5C schematically illustrate an example of the system frequency f calculated for conditions such that an actual system frequency $F_T$ of the power system fluctuates at a smaller change rate than the change rate of the rate limiter 46. Also, FIG. 5A illustrates an example when a phase jump occurs in the positive direction at a time T2. FIG. 5B illustrates an example when a phase jump occurs in a negative direction at the time T2.

As a result of diligent investigations, the inventor of the application discovered that when the actual system frequency $F_T$ of the power system fluctuates at a smaller change rate than the change rate of the rate limiter 46 as illustrated in FIGS. 5A and 5B, and when the system frequency f is calculated using the angular frequency ω output from the rate limiter 46, a mismeasurement of the system frequency f occurs, and the system frequency f undesirably fluctuates according to the change rate of the rate limiter 46. Also, the inventor of the application discovered that the system frequency f fluctuates in the increasing direction when the phase jumps to the positive direction, and the system frequency f fluctuates in the decreasing direction when the phase jumps in the negative direction as illustrated in FIGS. 5A and 5B.

Conversely, when the system frequency f is calculated using the predicted value ω' of the prediction calculator 50, the fluctuation (the slope) of the actual system frequency $F_T$ of the power system can be predicted based on the differential dω(t0)/dt of the angular frequency ω(t0) at the timing t0 at which it is determined that the phase jump occurred.

Accordingly, in the system frequency detector 10, the mismeasurement of the system frequency f when the phase jump occurs can be suppressed even when the phase jump occurs in a state in which the actual system frequency $F_T$ of the power system fluctuates at a smaller change rate than the change rate of the rate limiter 46 as illustrated in FIG. 5C.

As described above, the system frequency detector 10 according to the embodiment calculates the system frequency f based on the angular frequency ω output from the rate limiter 46, and when it is determined that a phase jump has occurred in the power system, switches to the predicted value ω' output from the prediction calculator 50 for a constant amount of time and calculates the system frequency f based on the predicted value ω' for a constant amount of time from the determination of the occurrence of the phase jump. Even when a phase jump or the like occurs in the power system, an abrupt fluctuation of the system frequency f can be suppressed thereby, and the error of the calculation of the system frequency f can be reduced. Also, the calculation of the system frequency f is an open loop; therefore, effects on the speed of the system voltage phase tracking by PLL can be suppressed even when the rate limiter 46 is provided in the part calculating the system frequency f. Accordingly, the system frequency detector 10 can be provided in which the change of the system frequency f can be quickly tracked, and an erroneous detection of the system frequency f can be suppressed even when a system disturbance occurs.

The constant amount of time of switching in the prediction calculator 50 is, for example, not less than about 10 msec and not more than about 300 msec. If the constant amount of time is too short, for example, there is a risk that the calculation of the system frequency f may be undesirably returned to using the rate limiter 46 in a state in which the system frequency f calculated by the rate limiter 46 is fluctuating as illustrated in FIG. 5A, FIG. 5B, etc. Therefore, it is favorable for the constant amount of time to be not less than 10 msec. On the other hand, if the constant amount of time is too long, there is a risk that an erroneous detection of the system frequency f may undesirably occur when the slope of the change of the actual system frequency $F_T$ of the power system fluctuates. Therefore, it is favorable for the constant amount of time to be not more than 300 msec. It is more favorable for the constant amount of time to be, for example, not less than about 100 msec and not more than about 200 msec. The erroneous detection of the system frequency f can be more appropriately suppressed thereby.

Figure 6:
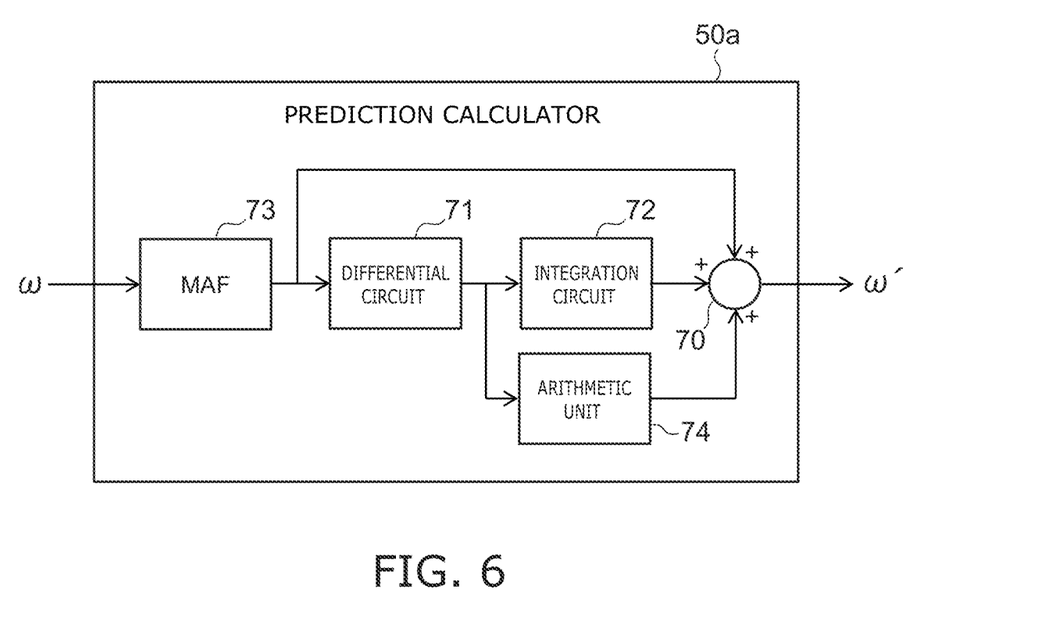
FIG. 6 is a block diagram schematically illustrating a modification of the prediction calculator.

FIG. 6 is a block diagram schematically illustrating a modification of the prediction calculator.

Components that are substantially the same functionally and configurationally as the embodiments described above are marked with the same reference numerals; and a detailed description is omitted.

As illustrated in FIG. 6, a prediction calculator 50a further includes a moving average filter 73 and an arithmetic unit 74.

The moving average filter 73 calculates the moving average of the angular frequency ω output from the rate limiter 46 and inputs the angular frequency ω after the moving average calculation to the adder 70 and the differential circuit 71.

The differential circuit 71 calculates the differential dω(t0)/dt based on the angular frequency ω(t0) after the moving average calculation input from the moving average filter 73 and inputs the differential dω(t0)/dt to the integration circuit 72 and the arithmetic unit 74.

As described above, the integration circuit 72 calculates the prediction change amount (t−t0)×dω(t0)/dt of the angular frequency ω by integrating the differential dω(t0)/dt, and inputs the prediction change amount (t−t0)×dω(t0)/dt to the adder 70.

The arithmetic unit 74 calculates the correction value of the prediction change amount calculated by the integration circuit 72 by multiplying the differential dω(t0)/dt input from the differential circuit 71 by a prescribed coefficient delaycomp. The arithmetic unit 74 inputs the calculated correction value to the adder 70.

The adder 70 calculates the predicted value ω' of the angular frequency ω by adding the angular frequency ω(t0) at the timing t0 at which it is determined that the phase jump occurred, the prediction change amount (t−t0)×dω(t0)/dt, and the correction value. In other words, the prediction calculator 50a calculates the predicted value ω' using the following Formula (2).

[Formula 2]

$$\omega'(t) = \omega(t0) + \frac{d\omega}{dt}(t0)(t-t0) + \frac{d\omega}{dt}(t0) \times delaycomp \quad (2)$$

Thus, the prediction calculator 50a calculates the predicted value ω' based on the angular frequency ω(t0), the prediction change amount (t−t0)×dω(t0)/dt, and the correction value.

There is a possibility that noise such as power supply noise, measurement noise, or the like may be superimposed onto the angular frequency ω output from the rate limiter 46.

If noise is superimposed onto the angular frequency ω(t0) when the differential dω(t0)/dt is calculated by the differential circuit 71, there is a possibility that a slope that corresponds to the noise may be erroneously calculated, and erroneous detection of the system frequency f may undesirably occur.

Therefore, the prediction calculator 50a further includes the moving average filter 73 and calculates the moving average of the angular frequency ω. Thereby, the effects of noise superimposed onto the angular frequency ω can be suppressed.

On the other hand, when the moving average filter 73 is provided, there is a possibility that a lag may undesirably occur in the predicted value of the system frequency f based on the predicted value ω' due to a phase lag due to the moving average filter 73. For example, when a phase jump occurs in a state in which the actual system frequency $F_T$ of the power system is fluctuating, there is a possibility that a lag may undesirably occur in the predicted value of the system frequency f.

Therefore, the prediction calculator 50a further includes the arithmetic unit 74, calculates a correction value of the prediction change amount, and calculates the predicted value ω' based on the angular frequency ω(t0), the prediction change amount (t−t0)×dω(t0)/dt, and the correction value.

The arithmetic unit 74 calculates the correction value to suppress the phase lag due to the moving average filter 73. For example, the coefficient delaycomp of the arithmetic unit 74 is set according to a window length $T_\omega$ of the moving average filter 73. For example, the coefficient delaycomp is set to a value that is about half (about 0.4 times to 0.6 times) of the window length $T_\omega$. For example, when the window length $T_\omega$ of the moving average filter 73 is 40 msec, the coefficient delaycomp is set to the value of 20 msec (0.02). The phase lag due to the moving average filter 73 can be suppressed thereby.

The window length $T_\omega$ of the moving average filter 73 is, for example, not less than 10 msec and not more than 100 msec. By setting the window length $T_\omega$ of the moving average filter 73 to be not less than 10 msec, the noise that is superimposed onto the angular frequency ω can be appropriately suppressed. By setting the window length $T_\omega$ of the moving average filter 73 to be not more than 100 msec, an excessively long phase lag due to the moving average filter 73 can be suppressed.

Thus, the prediction calculator 50a uses the moving average filter 73 to suppress the effects of the noise superimposed onto the angular frequency ω, and uses the arithmetic unit 74 to suppress the phase lag due to the moving average filter 73. Thereby, even when noise is superimposed onto the angular frequency ω, the effects of the noise can be suppressed, and the erroneous detection of the system frequency f can be more appropriately suppressed. The system frequency f can be more accurately detected.

For example, the moving average filter 73 and the arithmetic unit 74 may be omitted when the noise that is superimposed onto the angular frequency ω can be appropriately suppressed by the moving average filters 22, 23, etc., provided in the orthogonal coordinate signal generator 12, etc. In other words, the system frequency f may be predicted by the configuration of the prediction calculator 50 illustrated in FIG. 3.

Figure 7:
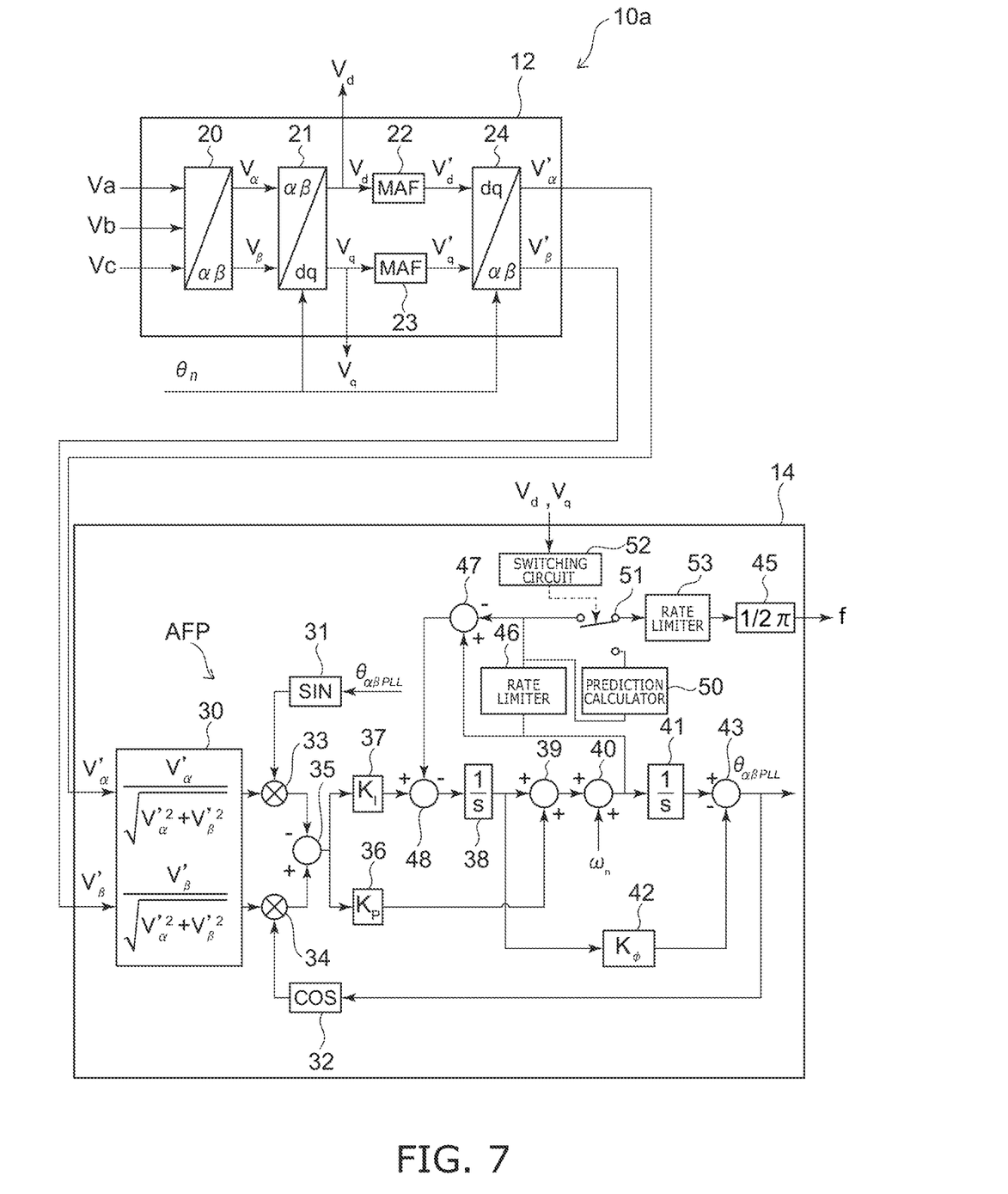
FIG. 7 is a block diagram schematically illustrating a modification of the system frequency detector.

FIG. 7 is a block diagram schematically illustrating a modification of the system frequency detector.

In the system frequency detector 10a as illustrated in FIG. 7, the frequency calculator 14 further includes a rate limiter 53 (a limiting part).

The rate limiter 53 is provided between the arithmetic unit 45 and the rate limiter 46 and between the arithmetic unit 45 and the prediction calculator 50. In other words, the rate limiter 53 is provided between the arithmetic unit 45 and the switching element 51. Thereby, one of the angular frequency ω output from the rate limiter 46 or the predicted value ω' output from the prediction calculator 50 is selectively input to the rate limiter 53.

The rate limiter 53 limits the change of the system frequency f equal to or greater than the prescribed change rate by limiting the change of the angular frequency ω or the predicted value ω' equal to or greater than the prescribed change rate. For example, the rate limiter 53 suppresses the change of the system frequency f not less than 4 Hz/sec.

Thus, by providing the rate limiter 53, an abrupt change of the system frequency f when the switching circuit 52 switches between the first state and the second state can be suppressed. In other words, the undesirable abrupt change of the system frequency f at the timing of switching from the angular frequency ω to the predicted value ω' or at the timing of switching from the predicted value ω' to the angular frequency ω can be suppressed.

Figure 8:
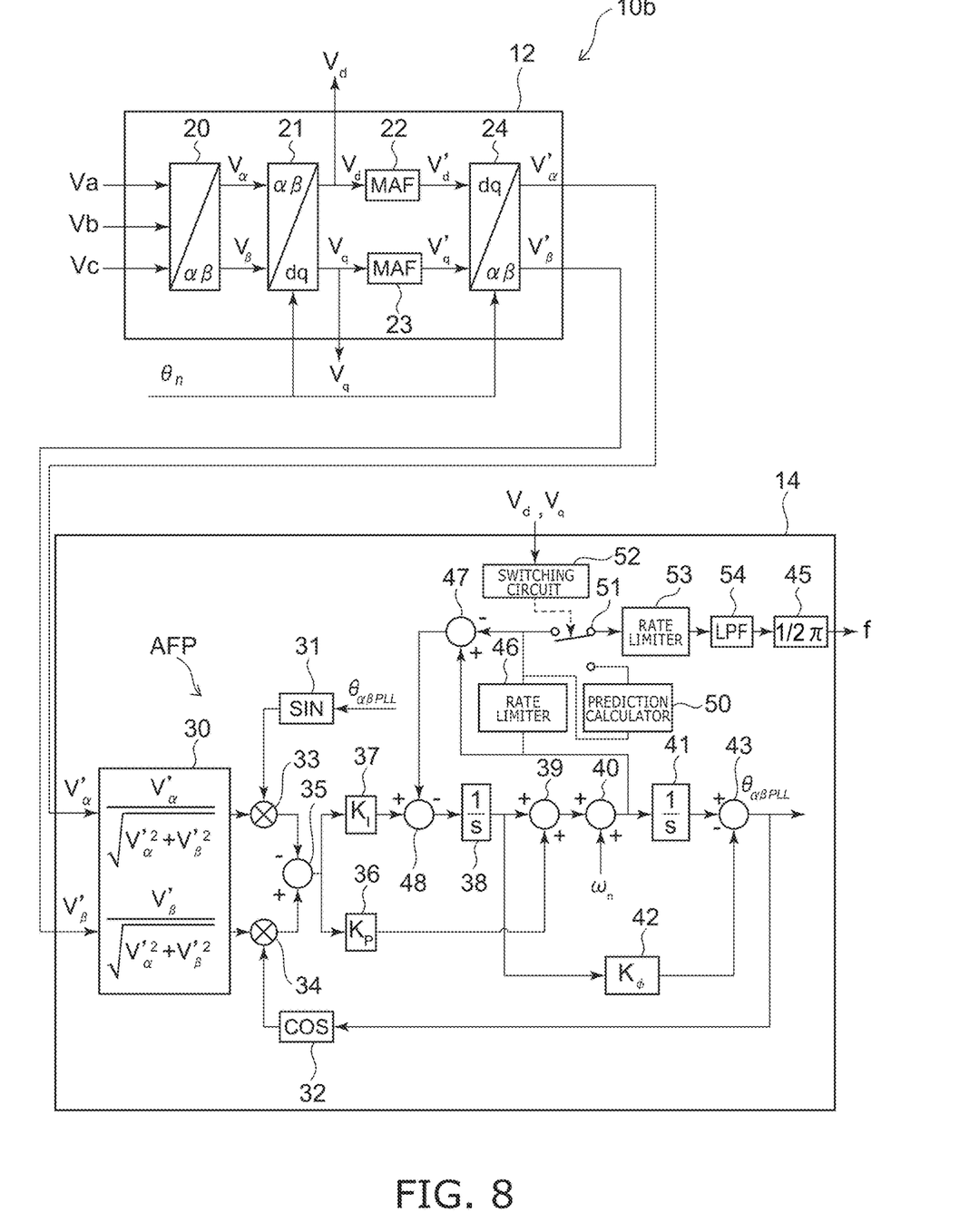
FIG. 8 is a block diagram schematically illustrating a modification of the system frequency detector.

FIG. 8 is a block diagram schematically illustrating a modification of the system frequency detector.

In a system frequency detector 10b as illustrated in FIG. 8, the frequency calculator 14 further includes a low-pass filter 54. The low-pass filter 54 is provided in series with the arithmetic unit 45. For example, the low-pass filter 54 is provided between the arithmetic unit 45 and the rate limiter 53.

The low-pass filter 54 suppresses high frequency components of the angular frequency ω or the predicted value ω'. The low-pass filter 54 attenuates higher frequency components than a prescribed frequency of the angular frequency ω or the predicted value ω'. In other words, the low-pass filter 54 suppresses an abrupt fluctuation of the angular frequency ω or the predicted value ω'. The low-pass filter 54 may include, for example, a moving average filter. The low-pass filter 54 inputs the angular frequency ω or the predicted value ω' after the high frequency components are suppressed to the arithmetic unit 45.

The low-pass filter 54 is provided in series with the arithmetic unit 45. The low-pass filter 54 suppresses the high frequency components of the system frequency f by suppressing the high frequency components of the angular frequency ω or the predicted value ω'. The low-pass filter 54 suppresses an abrupt fluctuation of the system frequency f.

Thus, by providing the low-pass filter 54, even when a phase jump or the like occurs in the power system, an abrupt fluctuation of the system frequency f can be suppressed, and the error of the calculation of the system frequency f can be further reduced.

The low-pass filter 54 is not limited to being provided between the arithmetic unit 45 and the rate limiter 53, and may be provided before the rate limiter 53 or may be provided after the arithmetic unit 45. The configuration of the low-pass filter 54 may be any configuration that can be provided in series with the arithmetic unit 45 and can suppress the high frequency components of the system frequency f.

According to embodiments described above, the configuration of an αβEPMAFPLL is schematically illustrated as the angular frequency calculator AFP of the frequency calculator 14. The configuration of the angular frequency calculator AFP is not limited thereto. The configuration of the angular frequency calculator AFP may be, for example, an EPMAFPLL (Enhanced Pre-filtering Moving Average Filter PLL) configuration, a PMAFPLL (Pre-filtering Moving Average Filter PLL) configuration, an EPMAFPLL Type 2 configuration, etc.

Hereinabove, embodiments of the invention are described with reference to specific examples. However, the embodiments of the invention are not limited to these specific examples. For example, one skilled in the art may similarly practice the invention by appropriately selecting specific configurations of components included in the system frequency detector 10, 10a, 10b from known art; and such practice is within the scope of the invention to the extent that similar effects can be obtained.

Also, any two or more components of the specific examples combined within the extent of technical feasibility also are within the scope of the invention to the extent that the spirit of the invention is included.

Furthermore, all system frequency detectors practicable by an appropriate design modification by one skilled in the art based on the system frequency detector 10, 10a, 10b described above as embodiments of the invention also are within the scope of the invention to the extent that the spirit of the invention is included.

Also, various modifications and alterations within the spirit of the invention will be readily apparent to those skilled in the art; and all such modifications and alterations also should be seen as being within the scope of the invention.

Although several embodiments of the invention are described, these embodiments are presented as examples and are not intended to limit the scope of the invention. These novel embodiments may be carried out in other various forms; and various omissions, substitutions, and modifications can be performed without departing from the spirit of the invention. Such embodiments and their modifications are within the scope and spirit of the invention and are included in the invention described in the claims and their equivalents.

The invention claimed is:

1. A system frequency detector, comprising:
an orthogonal coordinate signal generator generating an orthogonal two-phase voltage signal from a three-phase voltage signal of three-phase alternating current power of a power system by converting the three-phase voltage signal into an orthogonal two-phase voltage signal, converting the two-phase voltage signal into a voltage signal of a rotating coordinate system, calculating a moving average of the voltage signal of the rotating coordinate system, and performing an inverse transformation of the voltage signal of the rotating coordinate system after calculating the moving average; and
a frequency calculator including
an angular frequency calculator calculating an angular frequency of the power system based on the two-phase voltage signal after calculating the moving average generated by the orthogonal coordinate signal generator, and
an arithmetic unit calculating a system frequency of the power system from the angular frequency by multiplying the angular frequency by $1/2\pi$,
the angular frequency calculator calculating the angular frequency by performing a proportional-integral control based on the two-phase voltage signal,
the frequency calculator further including
a rate limiter limiting a change of the system frequency equal to or greater than a prescribed change rate, the rate limiter feeding back an output-input difference of the rate limiter to the calculation of the proportional-integral control of the angular frequency calculator, a prediction calculator calculating a predicted value of the angular frequency after a prescribed period of time has elapsed based on the angular frequency output from the rate limiter and a differential of the angular frequency, and a switching circuit selectively switching a first state of inputting the angular frequency output from the rate limiter to the arithmetic unit, and a second state of inputting the predicted value output from the prediction calculator to the arithmetic unit, the switching circuit detecting a phase jump of the power system based on the voltage signal of the rotating coordinate system calculated by the orthogonal coordinate signal generator, selecting the first state in a state in which the phase jump of the power system is not detected, selecting the second state for a constant amount of time when the phase jump of the power system is detected, and returning the second state to the first state after the constant amount of time has elapsed.

2. The system frequency detector according to claim 1, wherein the prediction calculator calculates a moving average of the angular frequency output from the rate limiter, calculates a differential of the angular frequency after the moving average, calculates a correction value by multiplying the differential by a prescribed coefficient, and calculates the predicted value based on the correction value, the differential, and the angular frequency after the moving average.

3. The system frequency detector according to claim 1, wherein the frequency calculator further includes a limiting part limiting a change of the system frequency equal to or greater than a prescribed change rate by selectively receiving input of at least one of the angular frequency output from the rate limiter or the predicted value output from the prediction calculator and by limiting a change of the angular frequency or the predicted value equal to or greater than a prescribed change rate.

4. The system frequency detector according to claim 1, wherein the frequency calculator further includes a low-pass filter provided in series with the arithmetic unit, and the low-pass filter suppresses a high frequency component of the system frequency.

* * * * *